United States Patent [19]

Dobos et al.

[11] Patent Number: 4,766,559
[45] Date of Patent: Aug. 23, 1988

[54] LINEARITY CORRECTING CONTROL CIRCUIT FOR TUNABLE DELAY LINE

[75] Inventors: Laszlo J. Dobos; Agoston Agoston, both of Beaverton, Oreg.

[73] Assignee: Tektronix Inc., Beaverton, Oreg.

[21] Appl. No.: 846,319

[22] Filed: Mar. 31, 1986

[51] Int. Cl.⁴ .............................................. H03M 1/68
[52] U.S. Cl. ..................................... 364/573; 364/571
[58] Field of Search .................. 379/41, 63, 284, 255, 379/253, 191, 193; 331/6, 177 V, 138; 455/194; 333/138; 381/53; 364/200, 571, 483, 573, 723

[56] References Cited

U.S. PATENT DOCUMENTS 4,064,396 12/1977 Panarello ............................ 364/573
4,282,578 8/1981 Payne et al. ........................ 364/573
4,349,886 9/1982 Ibar .................................... 364/573

Primary Examiner—Gary Chin
Assistant Examiner—Joe H. Cheng
Attorney, Agent, or Firm—John P. Dellett; Francis I. Gray

[57] ABSTRACT

A control circuit produces a control voltage for a tunable delay line in response to the magnitude of digital input data. The magnitude of the control voltage output corresponding to any digital input magnitude is independently adjustable to compensate for any nonlinear response of the delay to control voltage input such that the time delay produced by the delay line is substantially a linear function of the digital input to the control voltage source.

10 Claims, 3 Drawing Sheets

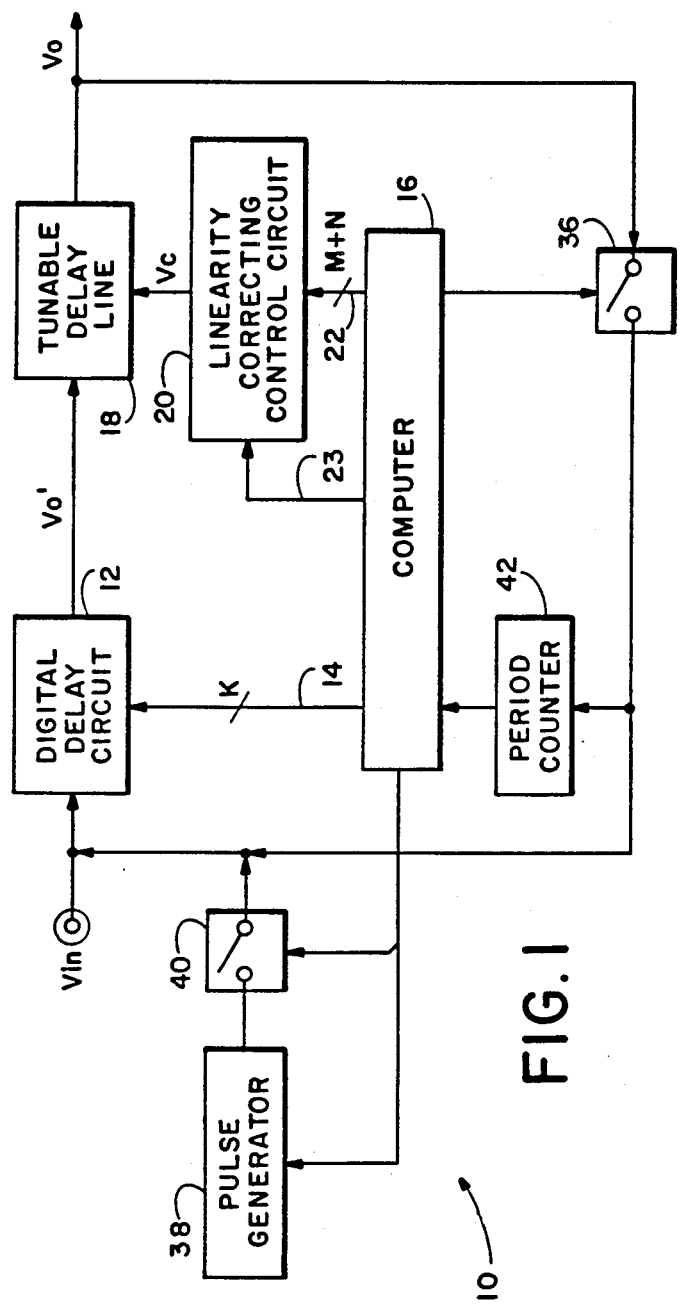

LINEARITY CORRECTING CONTROL CIRCUIT FOR TUNABLE DELAY LINE

BACKGROUND OF THE INVENTION

The present invention relates in general to voltage controlled tunable delay lines and more particularly to an apparatus for producing a control voltage for such a delay line in response to a digital control input.

Digital delay circuits are now commonly used to delay a digital signal by variable delay times. These delay circuits typically utilize a high stability reference clock to clock a programmable counter circuit. A typical digital delay circuit can produce a wide range of selectable delay times and the delay time produced is a highly linear function of the digital control data, thereby making the delay time easy to predict and control. However the resolution in delay time adjustment which can be obtained utilizing a digital delay circuit is limited by the period of the reference clock. With current semiconductor technology, the resolution limit is in the one nanosecond range. For higher resolution control over signal delay times, a delay line may be employed.

The delay time of a simple delay line can be adjusted with substantially unlimited resolution by trimming the length of the line. Delay lines can be simulated by lumped parameter networks wherein the delay time of the network is adjusted by adjusting the values of the network components. Such a delay line, described in U.S. Pat. No. 4,701,714, entitled TUNABLE DELAY LINE, issued Oct. 20, 1987, delays a signal by a variable delay time which can be controlled by varying the magnitude of an applied control voltage. The control voltage changes the capacitance of elements affecting the delay time of a lumped parameter network. The delay time resolution obtainable with this "tunable" delay line is much smaller than one nanosecond, depending on how finely the control voltage can be adjusted. While a digital to analog converter (DAC) could be used to produce the control voltage, the delay time produced by this tunable delay line is a somewhat nonlinear function of the control voltage and is therefore a nonlinear function of the digital input to the DAC. The nonlinear response of the tunable delay line makes the delay time produced by the delay line difficult to predict and difficult to control.

What is needed, and would be useful, is a circuit for converting digital control data to a control voltage for a nonlinear, voltage controlled delay line in such a way that the time delay produced by the delay circuit is a linear function of the digital control data. Such a circuit would simplify the use of the tunable delay line in conjunction with digital circuits.

SUMMARY OF THE INVENTION

According to one aspect of the invention, a linearity correcting control circuit produces a control voltage for a tunable delay line, the delay time of the delay line being a nonlinear function of the magnitude of the control voltage. The output voltage of the control circuit is an adjustable function of the magnitude of digital control data input and may be adjusted to compensate for non-linear response of the delay line such that the delay time is substantially a linear function of the digital input to the control voltage source.

In a preferred embodiment of the invention, the control circuit includes a first RAM, addressed by the most significant bits (MSBs) of the digital control data input to the control circuit, and a first digital to analog converter (DAC) for converting the digital output of the first RAM to a gross adjustment voltage signal of magnitude proportional to the value of the first RAM output data. The gross adjustment voltage signal is applied as the control voltage input to the tunable delay line. The data stored at each address of the first RAM is adjusted such that regular increases in the value m of the MSBs of the input control data addressing the first RAM causes regular decreases in the magnitude of the time delay produced by the tunable delay line.

According to another aspect of the invention, the control circuit includes a second RAM, also addressed by the MSBs of the input digital control data, and a second DAC for converting the output of the second RAM into a reference voltage of proportional magnitude. A third DAC is used as a multiplier to produce a fine adjustment voltage signal of magnitude proportional to the product of the reference voltage and the value n of the least significant bits (LSBs) of the digital control data input to the control circuit. The gross adjustment signal voltage is incremented by the amount of fine adjustment voltage prior to application as the control voltage input to the tunable delay line. The value of data stored at each address m in the second RAM is adjusted such that for each value m of MSBs of the input control data, the fine adjustment voltage has a range equal to the change in magnitude of the gross adjustment voltage when the magnitude m of the MSB portion of the control data is increased to m+1. With the data in the second RAM adjusted in this fashion, the control voltage produced by the control circuit is a piecewise linear function of the magnitude of input digital control data and, more importantly, the time delay produced by the tunable delay line is a substantially linear and continuous function of the magnitude of the input digital control data.

It is accordingly an object of the invention to provide a circuit for converting digital control data to a control voltage for a voltage controlled, nonlinear tunable delay line wherein the time delay produced by the delay circuit is a substantially linear function of the digital control data.

The subject matter of the present invention is particularly pointed out and distinctly claimed in the concluding portion of this specification. However, both the organization and method of operation, together with further advantages and objects thereof, may best be understood by reference to the following description taken in connection with accompanying drawings wherein like reference characters refer to like elements.

DRAWINGS

FIG. 1 is a block diagram of a system for delaying a signal by a variable delay time;

FIG. 2 is an illustration of a digital delay control word produced by the computer of the system of FIG. 1 for controlling the variable delay time;

DETAILED DESCRIPTION

FIG. 1 is a block diagram of a system 10 for delaying an input signal Vin by a variable delay time to produce a delayed output signal Vo. System 10 includes a digital delay circuit 12 adapted to delay Vin to produce an intermediate output signal Vo' which lags Vin by a variable delay time T1. The magnitude of T1 is a multiple of the magnitude k of K-bit digital control data transmitted to delay circuit 12 on lines 14 from a computer 16. Assuming the resolution (i.e., the smallest possible increment in delay time) of digital delay circuit 12 is, for instance, 3 nanoseconds, then when K is eight, the digital delay circuit 12 can produce any delay within a range of $2^8$ times 3 nanoseconds (768 nanoseconds) in steps of 3 nanoseconds. Digital delay circuits suitable for use as delay circuit 12 typically utilize a high stability clock to clock a programmable counter.

Figure 3:
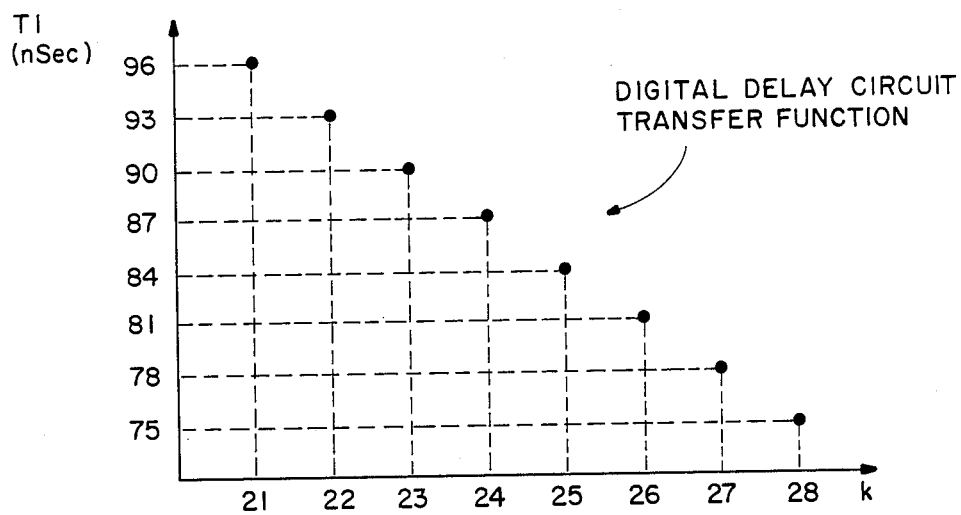
FIG. 3 is a graph of the transfer function of the digital delay circuit of the system of FIG. 1.

FIG. 3 is a graph of a small portion of the transfer function of digital delay circuit 12 which relates the magnitude k of the control input data to time delay T1. In this example, the value of k ranges from 21 to 28 while corresponding time delays range from 75 to 96 nanoseconds. The transfer function depicted in FIG. 3 is not continuous because the minimum delay time step size of the digital delay circuit 12 is 3 nanoseconds.

The output signal Vo' of the digital delay circuit 12 is transmitted through a tunable delay line 18 adapted to delay Vo' by a variable delay time T2 to produce the output voltage Vo. The tunable delay line 18 permits finer adjustment of the delay than is possible through the use of the digital delay circuit 12 alone. The magnitude of delay time T2 of delay line 18 is controlled by the magnitude of a control voltage Vc applied as input to the delay line and the control voltage Vc is produced by a "linearity correcting control circuit" 20 according to the present invention. The magnitude of control voltage Vc is a function of the magnitude of M+N bit control data produced by computer 16 and transmitted to the control circuit via data input line 22. Control circuit 20 is capable of producing a different control voltage Vc magnitude for each value of data provided on lines 22 such that control circuit 20 can produce $2^{M+N}$ different control voltage Vc magnitudes. Therefore the delay time T2 associated with tunable delay line 18 can be controlled to one part in, for instance, 65,536 if the M+N is 16. The range of delay times produced by delay line 18 is 6 to 9 nanoseconds corresponding to a control voltage input of 10 to 1 volts.

Digital delay circuit 12 and tunable delay line 18 thus cooperate to delay input voltage Vin by an adjustable delay time Td equal to T1+T2 to produce output voltage Vo. The magnitude of Td is controlled by the magnitude of a single K+M+N bit output data word produced by computer 16, as illustrated in FIG. 2, wherein the K most significant bits represent a value indicated by lower case character k, the M next most significant bits represent a value m, and the N least significant bits represent a value n. With K, M and N each equal to eight, and with the step size of delay circuit 12 set to 3 nanoseconds, the time delay Td provided by the system has a range of 768 milliseconds and a resolution of less than a picosecond. The time delay range may be increased by utilizing a digital delay circuit 12 which responds to more than eight input bits and the time delay resolution can be increased by utilizing a linearity correcting control circuit 20 which responds to more than sixteen control bits in order to resolve the tunable delay circuit control voltage Vc into more smaller steps.

Figure 4:
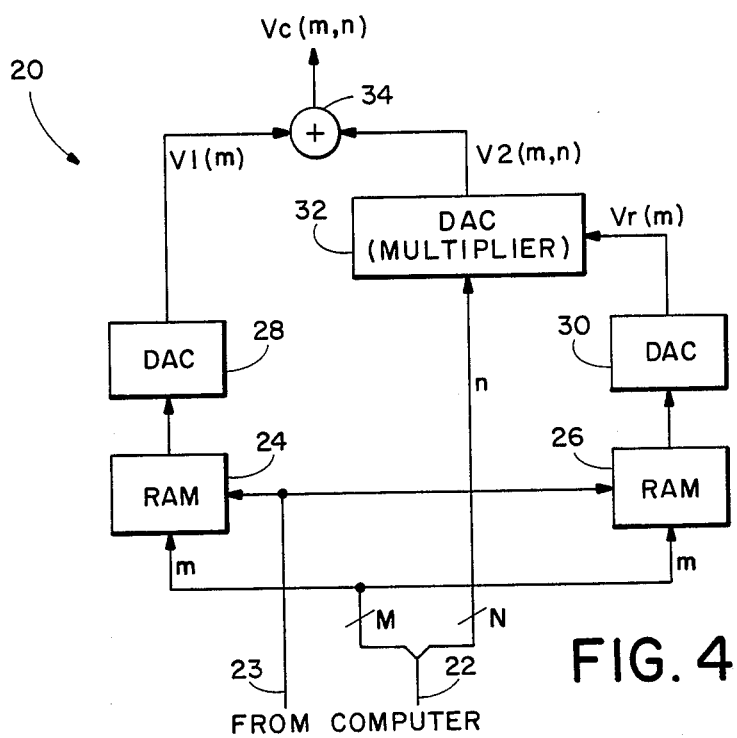
FIG. 4 is a block diagram of the linearity correcting control circuit of the system of FIG. 1.

Referring to FIG. 4, the linearity correcting control circuit 20 of FIG. 1, illustrated in block diagram form, includes a pair of random access memories (RAMs) 24 and 26, three digital to analog converters (DACs) 28, 30 and 32, and an analog summing circuit 34. RAM 24 is addressed by the M most significant bits of data carried on lines 22 from the computer 16 of FIG. 1 and stores data at each address relating the magnitude m of the M-bit address data to a particular control voltage Vc magnitude. When RAM 24 is addressed by a value m while in a memory read mode of operation, the data stored at address m is transmitted from RAM 24 to DAC 28 which converts the data to a voltage V1(m), a function of the magnitude of the data m addressing RAM 24. The computer 16 of FIG. 1 stores data at each address in RAM 24 through data input line 22 and read/write control line 23 connecting the computer to RAM 24. Since the data stored in RAM 24 can be modified, the value of V1(m) can be independently adjusted for any value of m.

The M most significant data bits on lines 22 from the computer also address RAM 26 which stores at each address slope data corresponding to the value m of the address. The computer 16 of FIG. 1 stores the slope data in RAM 26 utilizing data input and read/write control lines 23 and address lines 22 connecting the RAM 26 to the computer 16. When RAM 26 is addressed by a value m while in a memory read mode of operation, the data stored at address m is transmitted to DAC 30 which converts the data to a voltage Vr(m). The voltage Vr(m) provides a reference voltage for DAC 32 which converts the least significant bits n of the data on lines 22 to a corresponding voltage V2(m,n) which is equal to the product of Vr(m) and the magnitude of n. V1(m) and V2(m,n) are added by the analog summing circuit 34 to produce the control voltage Vc output of the control circuit 20.

Figure 5:
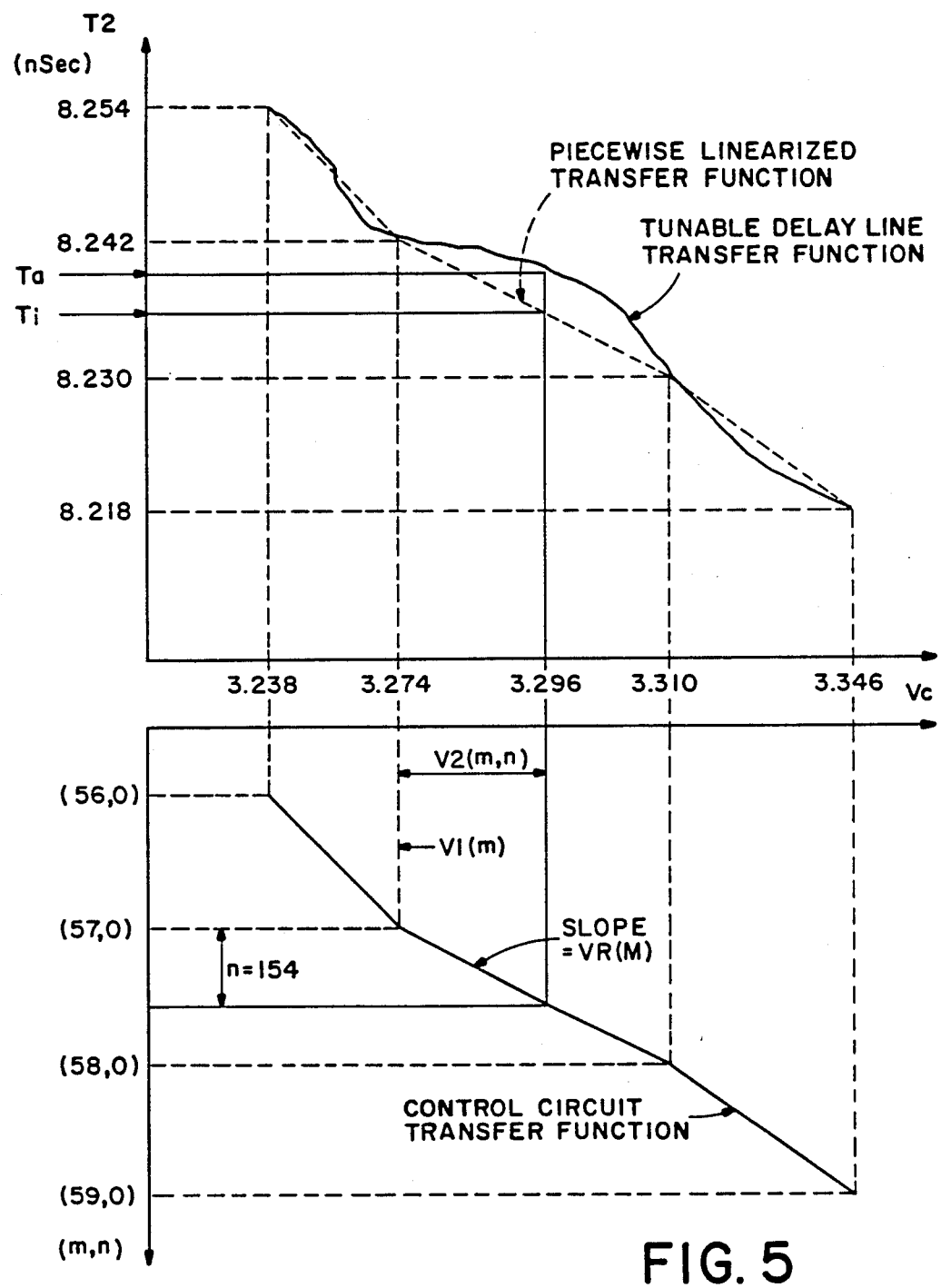
FIG. 5 is a graph illustrating the relationship between the digital input to the linearity correcting control circuit and the time delay output of the tunable delay line of FIG. 1.

A small portion of the transfer function of delay line 18 of FIG. 1 relating delay time T2 response to input control voltage Vc magnitude is graphed in FIG. 5. The delay line 18 accepts an input control voltage ranging from 1–10 volts and in FIG. 5 the portion of the delay line transfer function, shown in heavy solid line, includes control voltages Vc ranging from 3.238 to 3.346 volts. This range of control voltages corresponds to a time delay T2 range from 8.254 nanoseconds down to 8.218 nanoseconds.

FIG. 5 also includes a graph of a small portion of the transfer function of the linearity correcting control circuit 20 of FIG. 4 relating the control voltage Vc output of the control circuit to the values m and n of the M and N bit control data inputs to the control circuit. The portion of the control circuit transfer function illustrated in FIG. 5 includes the same range (3.238–3.346) of control voltages Vc as the portion of the tunable delay line transfer function shown in FIG. 5. The control voltage output Vc of the control circuit 20 is a piecewise linear function of the magnitude (m,n) of the control data input. The notation (m,n) indicates a value of a M+N bit digital word where m is the magnitude of the M most significant bits and n is the magnitude of the N least significant bits. The data stored in RAMs 24 and 26 are selected such that the value of m grossly determines the value of Vc while the value of n is utilized to finely adjust Vc between output voltages corresponding to successive values of m. If n is zero, then V2(m,n) is zero and Vc(m) is equal to V1(m). In such case the magnitude of Vc is entirely determined by the data stored in RAM 24 of FIG. 4. For instance, when n is zero, and m has a value of 57 (i.e., (m,n)=(57,0)) the control circuit produces a control voltage Vc of 3.274 volts. When (m,n)=(58,0) the control circuit produces a control voltage Vc of 3.310 volts. The slope of the control circuit transfer function between (m,n)=(57,0) and (m,n)=(58,0) is equal to the magnitude of Vr(57) produced by DAC 26 of FIG. 4. The data stored at address 57 of RAM 26 is adjusted such that the transfer function of the control circuit between (m,n)=(57,0) and (m,n)=(58,0) is linear and continuous. More particularly, the data stored in RAM 26 of the control circuit 20 of FIG. 5 is adjusted such that the value of the slope Vr(m) of the transfer function between (m,0) and (m+1,0) is determined by the expression:

$$Vr(m)=[V1(m+1)-V1(m)]/(2^N+1) \quad [1]$$

As the magnitude of n is increased, the magnitude of Vc increases proportionally since Vc=V1(m)+nVr(m). Assuming for instance that M and N are each eight bit values, m and n can each have a maximum value of 255. From FIG. 5 it is seen that (m,n)=(57,0) would result in a control voltage Vc output of 3.274 volts while (m,n)=(58,0) would yield a Vc value of 3.310 volts. The data in RAM 26 of FIG. 4 is adjusted so that Vr(m) for m=57 is $$Vr(57)=(3.310-3.274)/256=0.000141 \text{ volts}$$

so that the change in Vc between (m,n)=(57,0) and (m,n)=(58,0) is a linear and continuous function of the magnitude of n over the full range of n (0-255). The control data value (m,n)=(57,154) would cause the control circuit to produce a control voltage output of 3.296 volts as illustrated in FIG. 5. Thus the value of m is used to grossly adjust the value of Vc while the value of n is used to finely adjust Vc.

The Vc axis of the graphs of the transfer functions of the tunable delay line and the control circuit are aligned in FIG. 5 such that the time delay T2 produced by tunable delay line in response to any set of m and n values can be determined. For instance, when the value of m is 57 and the value of n is zero, (m,n)=(57,0), and the magnitude of the Vc voltage output of control circuit 20 is 3.274 volts. This control voltage value causes the tunable delay line to delay an input signal by 8.242 nanoseconds. Similarly, it can be seen that when (m,n)=(58,0) the time delay produced by the tunable delay line is 8.230 nanoseconds.

The data stored in RAM 24 of the control circuit 20 of FIG. 4 is adjusted such that when n=0, the delay time T2 produced by the tunable delay line is a linear function of the value m of the M bit control data applied to control circuit 20. As illustrated in FIG. 5, when the value of (m,n)=(56,0) T2 is 8.254 nanoseconds. If m is increased to 57, while n remains at zero, T2 decreases to 8.242 nanoseconds, a drop of 0.012 nanoseconds. If m is increased once again to 58, T2 drops to 8.230 nanoseconds, another drop of 0.012 nanoseconds. The data stored in RAM 24 of the control circuit 20 of FIG. 4 is adjusted such that for any value of m, an increase in m by 1 causes a decrease in T2 by 0.012 nanoseconds, provided n=0.

Thus it can be seen from FIGS. 4 and 5 that the value of the control voltage Vc is the sum of a gross adjustment signal V1(m) and a fine adjustment signal V2(m,n) where V2(m,n) is the product of n and a reference signal Vr(m). Further, the function V1(m) is adjusted by setting the values of data stored in RAM 24 such that the time delay T2 produced by the tunable delay line is a linear function of m when n is zero (i.e., T2(m,0)=Km where K is a constant). Finally, the function Vr(m) is adjusted by setting the values of data stored in RAM 26 according to equation [1] hereinabove in order to linearize Vc(m,n) with respect to n between Vc(m,0) and Vc(m+1,0).

With the data in RAM 24 and 26 adjusted in this fashion, the conversion circuit 20 of FIG. 4 linearizes the relationship between T2 and the value of m and substantially linearizes the relationship between T2 and the value of the M+N bit control circuit 20 input control data. Referring to FIG. 5, if m has a value of 57 and n has a value of 154, control circuit 20 produces an output Vc voltage of 3.296 volts. This voltage produces an actual delay time (designated Ta) of approximately 8.239 nanoseconds. However the computer 16 models the transfer function of the tunable delay line in a piecewise linear fashion (as indicated by the dotted function line in FIG. 5) when it is adjusting the data stored in RAMs 24 and 26 of FIG. 4, and when the computer sets m to a value of 57 and n to a value of 154, the intended delay time (designated Ti) is about 8.236 nanoseconds, as determined by the intersection of Vc=3.296 volts with the piecewise linear model of the tunable delay line transfer function. The difference between Ta and Ti is the error resulting from the nonlinear behavior of T2 between Vc=3.274 volts and Vc=3.310 volts. The error can be reduced (at the expense of increasing the size of RAM 24) by increasing the number of bits of control data M so that the piecewise linear approximation of the delay line transfer function more closely approximates the actual transfer function of the tunable delay line.

In order to properly adjust the data in RAMs 24 and 26, the response of the tunable delay line 18 of to FIG. 1 must be measured. Referring to FIG. 1, the output voltage Vo of the tunable delay circuit 18 is fed back through a switch 36, controlled by computer 16, to the input of digital delay circuit 12. The output of a pulse generator 38 is also connected to the input of digital delay circuit 12 through a switch 40 controlled by computer 16. To test the delay time T2 associated with a particular value of m applied to control circuit 20, the computer 16 closes switches 36 and 40, sets m to the particular value, sets n to zero, and then transmits a control signal to the pulse generator 38 causing it to transmit a pulse to delay circuit 12. This pulse passes through circuit 12 and delay line 18 and then returns to the input of delay circuit 12. The pulse continues to circulate through circuits 12, delay line 18 and switch 36 until switch 36 is opened. A period counter 42, having its input connected to a terminal of switch 36, measures the time period between successive occurrences of the pulse as it passes through switch 36 and transmits data indicating the measured the period to computer 16. From this data, and from the known delay T1 of digital delay circuit 12, the computer computes the time delay T2 provided by the tunable delay line 18 in response to the particular value of m. The computer 16 can then increase or decrease the value of data stored at address m of RAM 24 of FIG. 4 to adjust the delay time T2 associated with m. By using an iterative measurement and adjustment process, the computer 16 adjusts the data in RAM 24 for each value of m so that the time delay T2 of delay line 18 is a linear function of the magnitude m of the most significant bits M of data on line 22. The computer then adjusts the value of data stored in RAM 26 according to equation [1] hereinabove so that the value of Vc can be finely adjusted in proportion to the magnitude n of the least significant N bits of data on lines 22.

Thus the control circuit 20 of FIG. 4 according to the present invention, produces a control voltage for a tunable delay line of the type which delays a signal by a variable delay time, the delay time being a nonlinear function of the magnitude of the control voltage. The output voltage of the control circuit is determined by the magnitude of digital control data input and the control circuit includes provisions for independently adjusting the magnitude of its output voltage produced in response to each magnitude of digital input. The delay time response of the tunable delay line to a range of control data inputs is measured and adjusted by adjusting the magnitude of the control voltage to compensate for nonlinear response of the delay line such that the delay time is a substantially linear function of the digital input to the control voltage source.

While a preferred embodiment of the present invention has been shown and described, it will be apparent to those skilled in the art that many changes and modifications may be made without departing from the invention in its broader aspects. The appended claims are therefore intended to cover all such changes and modifications as fall within the true spirit and scope of the invention.

We claim:

1. A contol circuit for providing an analog signal input to a tunable delay line, wherein the duration of a signal delay produced by the tunable delay line is a nonlinear function of the magnitude of the analog signal, the control circuit comprising:
   means for storing a range of values accessible through an output in accordance with digital input data;
   means responsive to the accessed output of said storing means for producing said analog signal in proportion to said accessed output;
   means for iteratively measuring the response of the tunable delay line; and
   means for adjusting the stored values responsive to the measured response of the tunable delay line,
   wherein the accessed output provided in response to each magnitude of digital input data is such that the duration of the time delay produced by the tunable delay line is a substantially linear function of the digital input data.

2. A control circuit for providing a control signal input to a tunable delay line, wherein the duration of a signal delay produced by the tunable delay line is a nonlinear function of the magnitude of the control signal, the control signal magnitude being controlled by the magnitude of digital input data having a first portion containing a predetermined number of most significant bits and a second portion containing a predetermined number of least significant bits, said digital input data being applied to the control circuit, the control circuit comprising:
   means for generating a gross adjustment signal whose magnitude is an adjustable first function of said first portion of the digital input data;
   means for generating a reference signal whose magnitude is an adjustable second function of said first portion of the digital input data;
   means for iteratively measuring the response of the tunable delay line;
   means for adjusting the value of the gross adjustment signal and the reference signal responsive to the measured response of the tunable delay line;
   means for generating a fine adjustment signal whose magnitude is proportional to the product of said reference signal and said second portion of the digital input data; and
   means for combining the gross adjustment signal and the fine adjustment signal to produce the control signal input to the delay line.

3. The circuit according to claim 2 wherein the means for generating a gross adjustment signal comprises:
   memory means for outputting stored gross adjustment data when addressed by the first portion of the digital input data; and
   means for converting the gross adjustment data output of the memory means into the gross adjustment signal whose magnitude is proportional to the gross adjustment data.

4. The circuit according to claim 2 wherein the means for generating a reference signal comprises:
   memory means for outputting stored reference data when addressed by the first portion of the digital input data; and
   means for converting the reference data output of the memory means into the reference signal whose magnitude is proportional to the reference data.

5. The circuit according to claim 2 wherein the means for generating a fine adjustment signal whose magnitude is proportional to the product of the reference signal and the magnitude of the second portion of the digital data comprises a digital to analog converter, the reference signal being applied as a reference voltage input and the second portion of the digital data being applied as a digital input to the digital to analog converter.

6. The circuit according to claim 2 wherein the first function is adjustable such that the duration of the signal delay produced by the tunable delay line is a linear function of the magnitude of the first portion of the digital input data when the second portion of the digital input data has zero magnitude.

7. The circuit according to claim 6 wherein the first and second functions are adjusted such that the magnitude of the control signal generated by the control circuit is a piecewise continuous linear funcation of the magnitude of the digital input data.

8. A control circuit for providing an analog control signal input to a tunable delay line, wherein the duration of a signal delay produced by the tunable delay line is a nonlinear function of the magnitude of the control signal, the control signal magnitude being controlled by the magnitude of digital input data having a first portion containing a predetermined number of most significant bits and a second portion containing a predetermined number of least significant bits, said digital input data being applied to the control circuit, the control circuit comprising:
   means responsive to the first portion of the digital input data for producing gross adjustment data;
   means for converting the gross adjustment data into an analog gross adjustment signal whose magnitude is proportional to the gross adjustment data;

means responsive to the first portion of the digital input data for producing reference data;

means for converting the reference data into an analog reference signal whose magnitude is proportional to the reference data;

means for iteratively measuring the response of the tunable delay line;

means for adjusting the gross adjustment data and the reference data responsive to the measured response of the tunable delay line;

means for generating an analog fine adjustment signal whose magnitude is proportional to the product of the reference signal and the second portion of the digital input data; and means for combining the gross adjustment signal and the fine adjustment signal to produce the control signal input to the tunable delay line.

9. The circuit according to claim 8 wherein the first relation is adjusted such that the delay time of the tunable delay line is a linear function of the magnitude of the first portion of the digital input data when the second portion of the digital input data is zero.

10. The circuit according to claim 8 wherein the gross adjustment data and the reference data are adjusted such that the magnitude of the control signal generated by the control circuit is a piecewise linear function of the digital input data.

* * * * *